United States Patent [19]

Araki

[11] Patent Number: 4,534,623

[45] Date of Patent: Aug. 13, 1985

[54] HORIZONTALLY-STACKED METAL-INSULATOR-METAL ELEMENT FOR ELECTRO-OPTICAL DEVICE AND METHOD FOR MANUFACTURE

[75] Inventor: Ryosuke Araki, Suwa, Japan

[73] Assignee: Kabushiki Kaisha Suwa Seikosha, Tokyo, Japan

[21] Appl. No.: 571,416

[22] Filed: Jan. 17, 1984

[30] Foreign Application Priority Data

Jan. 18, 1983 [JP] Japan ................................. 58-6502

[51] Int. Cl.³ ................................................ G02F 1/13
[52] U.S. Cl. ................................ 350/339 R; 350/333; 350/334
[58] Field of Search ...................... 350/333, 334, 339 R

[56] References Cited

U.S. PATENT DOCUMENTS 4,413,883 11/1983 Baraff et al. ................. 350/333 X

FOREIGN PATENT DOCUMENTS 58-31321 2/1983 Japan ................................. 350/333

OTHER PUBLICATIONS

Baraff, D. R. et al., "The Optimization of Metal-Insulator-Metal Non-Linear Devices for Use in Multiplexed Liquid Crystal Displays," *Biennial Display Research Conference of IEEE*, Oct. 1980, pp. 107–110.
SID 82 Digest-pp. 248-249, 20.6/3:40 P.M.: MIM Addressed LCD's: Status and Prospects Streater, Este, Maniv, MacLaurin and Miner Bell–Northern Research, Ltd., Ottawa, Canada.

Primary Examiner—John K. Corbin
Assistant Examiner—Richard F. Gallivan
Attorney, Agent, or Firm—Blum, Kaplan, Friedman, Silberman & Beran

[57] ABSTRACT

The invention is directed to an electro-optical device. The device incorporates a liquid crystal display panel wherein each display cell utilizes a non-linear metal insulator metal element. The layers of the metal insulator metal element are formed in a horizontal direction to provide an MIM which is smaller in size and inexpensive to manufacture. It also allows a liquid crystal display to be formed which is capable of high resolution image display.

16 Claims, 18 Drawing Figures

HORIZONTALLY-STACKED METAL-INSULATOR-METAL ELEMENT FOR ELECTRO-OPTICAL DEVICE AND METHOD FOR MANUFACTURE

BACKGROUND OF THE INVENTION

This invention relates to an electro-optical device utilizing a liquid crystal display device wherein non-linear elements composed of Metal-Insulator-Metal (MIM) elements are arranged in a matrix corresponding to picture display cells.

Recently, liquid crystal display devices have found wide spread use in many fields including applications in wrist watch and electronic calculator technology. These devices employ flat type display units and can be driven at low voltages, thus requiring low power consumption. However, when these devices are employed in information display terminals or small hand-held electronic equipment there are some disadvantages. These display devices yield an image with relatively poor contrast regardless of the level of the driving voltage. In addition, the resolution and capacity of displayed information in any one picture frame is limited due to the inability to multi-digit matrix drive the display.

In order to eliminate these disadvantages and increase the amount of information that can be shown on any one frame, non-linear elements, such as MIMs, can be used conjunction with the liquid crystal display device. In the prior art, each MIM element is constructed by anodyzing the surface of a Ta film pattern and forming a Cr pattern thereon. Using this construction, a metal-insulator-metal element is formed by layering in the vertical direction at the junction of the overlapping Ta pattern and Cr pattern.

In the conventional MIM element, the overlapping portion of the Ta film with the Cr pattern becomes a separate region and the size of the region is limited by the minimum area that the pattern forming method requires. The limit in practical terms is a ten micrometer square. Therefore, the actual size of the picture element cannot be further reduced and this makes it difficult to improve display resolution capacity.

Accordingly, it is desirable to provide a MIM element which overcomes these problems of the prior art and reduces in the size of the MIM element.

SUMMARY OF THE INVENTION

Generally speaking, in accordance with the invention, an improved electro-optical device including a metal-insulator-element which is formed in the horizontal direction with a vertically oriented Ta film is provided. The size of the MIM element is greatly reduced without the need of a high resolution mask aligner to yield a liquid crystal display cell which has a larger and more uniform surface.

Accordingly, it is an object of the invention to provide an improved electro-optical device.

Another object of the invention is to provide an improved electro-optical device which yields a display having a high resolution.

A further object of the invention is to provide an electro-optical device which is inexpensive to manufacture.

Yet a further object of the invention is to provide an improved electro-optical device which is easily assembled.

Still other objects and advantages of the invention will in part be obvious and will in part be apparent from the specification.

The invention accordingly comprises features of construction, combination of elements and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF PREFERRED EMBODIMENTS

This invention relates to an electro-optical device utilizing a liquid crystal display device, and more particularly to a device including a metal-insulator metal non-linear element arranged in a matrix corresponding to a picture display cell.

Figure 1:
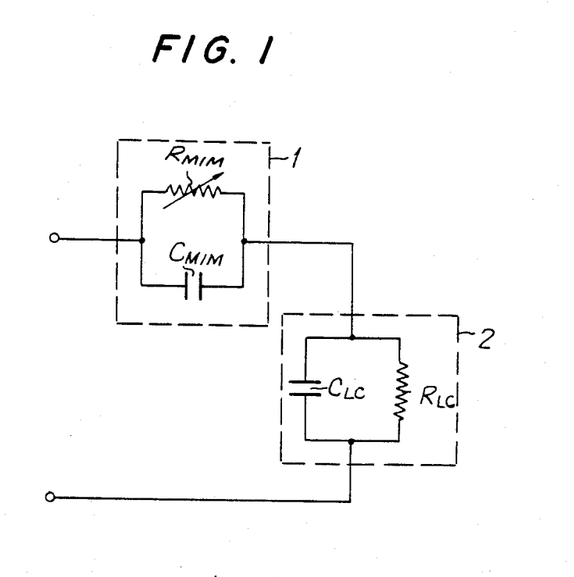
FIG. 1 is a schematic circuit representation of a display cell formed from an MIM element and liquid crystal display cell.

Referring to FIG. 1, a non-linear MIM equivalent circuit is shown wherein a display element of the device is formed of a MIM element 1 and a liquid crystal display element 2. MIM element 1 and liquid crystal display element 2 are connected in series. The MIM element is the equivalent of a non-linear resistor $R_{MIM}$ and a capacitor $C_{MIM}$. The liquid crystal display element is the equivalent of a resistor $R_{LC}$ and a capacitor $C_{LC}$ which are connected in parallel. When the display element is selectively driven by a matrix addressing scheme, an electric charge can accumulate in capacitor $C_{LC}$ of liquid crystal display element 2 since MIM element 1 exhibits low resistance. When the display element is not selected, the electric charge is maintained in capacitor $C_{LC}$ since MIM element 1 has high resistance.

In this way, an electric current can be applied to a liquid crystal material to control its orientation and visibility stage, and information can thereon be displayed.

In the equivalent circuit shown in FIG. 1, if the capacitance of capacitor $C_{MIM}$ of MIM element 1 is small in comparison to capacitor $C_{LC}$, the effect of voltage which is applied to the liquid crystal material is determined by the relationship among the non-linearity of MIM element 1, capacitor $C_{LC}$ and resistor $R_{LC}$ of liquid crystal display element 2. Among these three elements, the values of capacitor $C_{LC}$ and resistor $R_{LC}$ of liquid crystal 2 depend on the size of the display element electrode, cell gap and the liquid crystal material chosen. The characteristic of the MIM element can be chosen to correspond to the aforementioned values of liquid crystal display element 2. For example, when a nematic liquid crystal having a dielectric anisotropy $\Delta\Sigma$ equal to 27 (wherein $\Sigma$ horizontal is 35 and $\Sigma$ vertical is 8), a threshhold voltage equal to 1.1 volts rms and a saturation voltage equal to 1.5 volts rms, is sealed in a cell which is 0.4 millimeters square and has a gap of 7 micrometers and when this twisted nematic cell is driven in a duty cycle equal to 1/500, the size of the MIM element needs to be approximately 5 micrometers square. This MIM element may be formed from a construction of Ta-Ta$_2$O$_5$-Cr.

Figure 2:
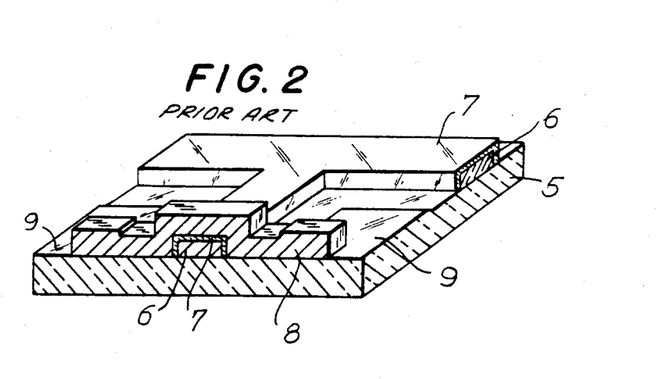
FIG. 2 is a partial cross-sectional view of a conventional MIM element.
Figure 3:
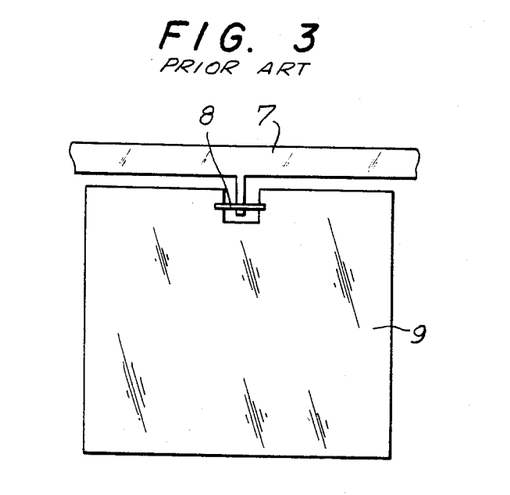
FIG. 3 is a top plan view of a conventional electro-optical device using the conventional MIM element.

Referring now to FIG. 2, the construction of a conventional MIM element is shown. A Ta film 6 is formed on a transparent substrate 5 made of an insulating material, such as glass, by sputtering, evaporation, etc. Ta film 6 is then given a fixed shape through the use of selective etching. During this etching, Ta wiring and one electrode of the MIM element are simultaneously constructed. Next, Ta film 6 is anodized in 0.01 weight percent of a citric acid in water solution to form an oxide film 7. A transparent conductive film, such as ITO, is formed on substrate 5 and photo-etched to make a transparent electrode 9. Chromium is evaporated thereon and photo-etched to a fixed shape to form a second electrode 8 of the MIM element. In this way, a substrate for a liquid crystal display panel utilizing an MIM element is constructed.

In a liquid crystal display device utilizing an MIM element, the minimum size of one display element is limited according to the size of the MIM element. The minimum size of the MIM element is fixed by the accuracy of the photo-etching process, and particularly the resolution of the photo-lithography steps. It has been found that a five micrometer size of patterning accuracy is required for forming an MIM element which can drive a display cell which is 0.4 millimeters square. This requirement results in the need for a high resolution mask aligner. However, the wafer size is currently too small to carry out such a highly accurate mask alignment. Therefore, by using photo-lithography the maximum size that a wafer can be produced is five inches. It has been impossible for a mask aligner to align a mask for a wafer which is more than five inches without also degrading the resolution power. Additionally, a high resolution mask aligner is expensive, so the cost of a liquid crystal display panel is high.

In order to gain high resolution with the use of many liquid crystal picture elements, a picture element of 0.2 millimeters square can be used. In this case, the size of an MIM element must be 2.5 micrometers square. Unfortunately, it is impossible to mass-produce such small size MIM elements with a 100% yield even when using the latest fabrication techniques. It is therefore a primary object of this invention to provide an electro-optical device having a large display panel which does not suffer the above-mentioned disadvantages.

When forming a liquid crystal optical device in accordance with the invention, an MIM element is not formed by layering in the vertical direction as is usual. Instead the MIM element is formed in the horizontal direction so that the minimum size of each MIM element can be reduced compared to the conventional constructions.

Turning now to the design specifications required for each MIM element, the current-voltage characteristic of an MIM element is given by:

$$I = KV\exp(\beta \sqrt{V}) \tag{1}$$

where I is current, V is voltage, and K and $\beta$ are represented by:

$$K = ne\mu \cdot \frac{S}{t} \exp\left(\frac{-\phi}{\kappa T}\right) \tag{2}$$

$$\beta = \frac{1}{\kappa T}\left(\frac{e^3}{\pi\Sigma_o\Sigma t}\right)^{\frac{1}{2}} \tag{3}$$

In formulas (2) and (3), n is electron density, e is charge, $\mu$ is mobility, S is area, t is thickness of the insulator film, $\phi$ is donor level, $\kappa$ is Boltzmann constant, T is temperature, $\Sigma_o$ is the dielectric constant under vacuum and $\Sigma$ is permittivity of the insulator.

Based on these relationships, as the thickness of the insulator film increases, the current decreases according to an expomential function.

The current ratio of an MIM element in the case that the thickness of an insulator film t and an element area S are different is given by:

$$\frac{I_1}{I_2} = \frac{t_2}{t_1} \cdot \frac{S_1}{S_2} \exp\left\{\frac{1}{\kappa T}\left(\frac{e^3 V}{\pi\Sigma_o\Sigma}\right)^{\frac{1}{2}}\left(\frac{1}{t_1} - \frac{1}{t_2}\right)\right\}^{\frac{1}{2}} \tag{4}$$

wherein each parameter is represented with adding FIGS. 1 and 2 of MIM elements 1 and 2 respectively. When setting the temperature at 300° K. and substituting each value into equation (4), the following equation (5) is obtained:

$$\frac{I_1}{I_2} = \frac{t_2}{t_1} \cdot \frac{S_1}{S_2} \exp\left\{1.276 \times 10^3 \left(\frac{1}{t_1} \; \frac{1}{t_2}\right) \frac{1}{2} V \frac{1}{2}\right\} \tag{5}$$

Table 1 shows the current ration $I_1$ to $I_2$ using the voltage V and the thickness of insulator film $t_2$ of MIM element 2 as a parameter, wherein the element area $S_1$ and $S_2$ of MIM elements 1 and 2 are of a size and the thickness of insulator film $t_1$ of MIM element 1 is 500 Å.

TABLE 1

The variation of current ratio $\left(\dfrac{I_1}{I_2}\right)$ according to the thickness of insulator film of an MIM element.

| (Å) | (V) | | | |
|---|---|---|---|---|
| | 1 | 5 | 10 | 20 |
| 1000 | $1.13 \times 10^2$ | $6.02 \times 10^2$ | $1.66 \times 10^4$ | $6.98 \times 10^5$ |
| 2000 | $5.60 \times 10^2$ | $4.34 \times 10^3$ | $2.52 \times 10^3$ | $2.46 \times 10^7$ |
| 5000 | $2.24 \times 10^3$ | $2.11 \times 10^4$ | $1.82 \times 10^6$ | $2.73 \times 10^8$ | voltage (V); film thickness (Å); $t_1 = 500Å$

As shown in Table 1, when the insulator film $t_2$ is doubled, that is, 500 Å to 1000 Å, the current value decreases about $10^2$ in 1 V. This tendency increases as the voltage becomes high.

In an effort to make the best of this property of an MIM element in a construction made according to an embodiment of the invention, the thickness of the insulator film is increased in the vertical direction and decreased in the horizontal direction. This yields an MIM element which is active in a horizontal direction and allows the size of the MIM element in top plan view to be reduced.

Figure 4A:
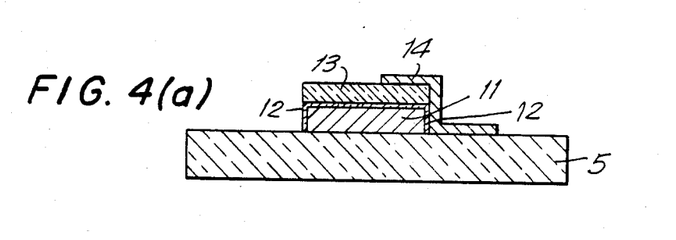
FIGS. 4(a) and 4(b) are cross-sectional views of an MIM element constructed in accordance with the invention.
Figure 4B:
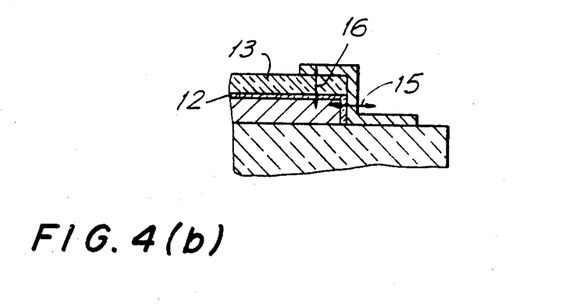
Figure 5A:
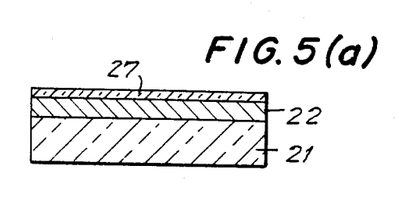
FIGS. 5(a) to 5(d) are cross-sectional views showing an MIM element constructed in accordance with the invention during the process of manufacture.
Figure 5B:
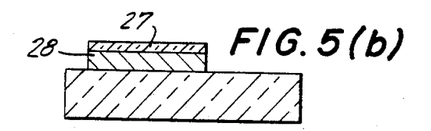
Figure 5C:
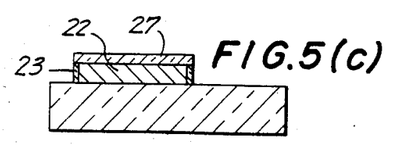
Figure 5D:
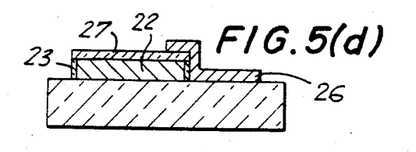
Figure 6A:
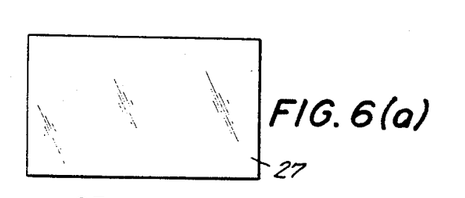
FIGS. 6(a) through (6d) are top plan views of the MIM elements shown in FIGS. 5(a) to 5(d)
Figure 6B:
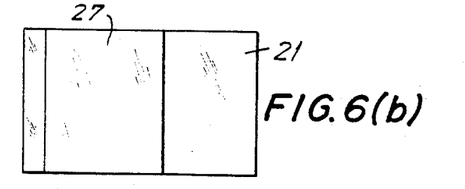
Figure 6C:
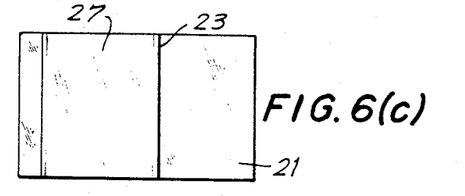
Figure 6D:
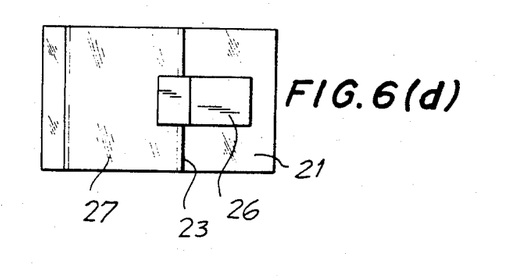

Referring now to FIGS. 4(a) and 4(b) an MIM element constructed in accordance with one embodiment of the invention is illustrated. A metal film 11 is formed on an insulating substrate 5 and is covered with an oxide film 12 which is formed by oxidizing metal film 11. A thick insulating film 13 is formed on top planar surface of metal film 11. Insulating oxide film 12 is thin and is formed on the side of metal 11. Additionally, a second metal film 14 is formed both on the top of insulating film 13 and on the side edges of metal film 11. In this way, an MIM element 15 can be constructed using the combination of metal film 11, metal oxide film 12 and metal film 14. However, a second MIM element 16 is also formed in the area where metal film 14 overlaps with metal film 11. This overlapping occurs during the manufacturing process. If insulating film 13 is as thick as insulating film 12, then the electrical properties of MIM element 16 will dominate the electrical properties of MIM element 15, since the area of MIM element 16 is larger than that of MIM element 15.

As shown above, the current-voltage characteristics of an MIM elements are dependent upon the thickness of the insulating film. Therefore, if insulating film 13 is thicker than insulating oxide film 12, it is possible to disregard the influence of MIM element 16 upon MIM element 15 by varying thicknesses of the insulating films of MIM elements 15 and 16 according to equations (1) or (4).

With a construction made according to the present invention, the size of an MIM element can be reduced without the need for a high resolution mask aligner. For example, when utilizing a mask aligner having a dimensional accuracy of 15 micrometers, a conventional MIM element will have a minimum size of 15 micrometers square [and an element area equal to 225 $\mu m^2$]. On the other hand, when an MIM element is formed according to the invention in a horizontal direction, the size of the same MIM element can be equal to about 1.9 $\mu m^2$ [or an element area of 3.75 $\mu m^2$], if metal film 11 is 25 Å thick and metal film 14 has a minimum thickness of 15 micrometers. The size of the MIM element will equal the product of 2500 Å × 15 micrometers, and the element size can be reduced to approximately 15% of that of an element conformed according to the conventional process.

Referring now to FIGS. 5 and 6, the process of manufacturing an electro-optical display device having an MIM element manufactured in accordance with the invention is shown. FIG. 5 is a cross-sectional view and FIG. 6 is a top plan view of the manufacturing steps with FIGS. 6(a) through 6(d) illustrating the sequence of the process. A Ta film 22 approximately 2500 Å thick is formed on a transparent substrate 21. Substrate 21 is made of an insulator material, such as glass. Ta film 22 has been anodized to form a Ta oxide film 27 having a thickness approximately equal to 2000 Å. The anodizing steps are performed by dipping substrate 21 into a 0.01% citric acid in water solution and applying 120 volts to the solution. This yields a construction shown in FIGS. 5(a) and 6(a). Ta film 22 and Ta oxide film 27 are selectively etched to a fixed shape through a photo-etching method. This results in a construction shown in FIGS. 5(b) and 6(b). An etched side 28 of Ta film 22 is exposed by etching is anodized to form an oxide film 23 on the side. This is shown in FIGS. 5(c) and 6(c). Since the thickness of oxide film 23 is proportional to the voltage applied during the anodizing process, the applied voltage for forming anodizing film 23 is approximately 30 volts. This is ¼ of the anodizing voltage, and yields oxide film 23 having a thickness of about 500 Å. Finally, a Cr film 26 which will become one electrode of the MIM element, is formed through photo-etching to its desired shape. This is shown in FIGS. 5(d) and 6(d). The electrode is formed in such a way as to reduce the overlapping portion of Cr film 26 with Ta oxide film 27 as much as possible. Through this method, an MIM element is formed on an electro-optical display substrate.

To complete the construction of the electro-optical device, a transparent electrode for the liquid crystal display is formed on the substrate and a $SiO_2$ passivation film having a thickness of 1500 Å and a polymide film is deposited thereon to be rubbed for orienting the liquid crystal material. A complimentary substrate of the liquid crystal display device is formed in the same manner. The opposite substrate has a transparent electrode formed to a desired shape and the liquid crystal material is encapsulated into the space between the substrate having the MIM elements and the opposing substrate having the transparent electrode. This completes construction of the liquid crystal display device in accordance with the invention.

When an MIM element is made in accordance with the invention, it can have a size in plan view which is one-tenth as small as a conventional MIM element using the same manufacturing equipment, but relying on the processes of the prior art.

Figure 7:
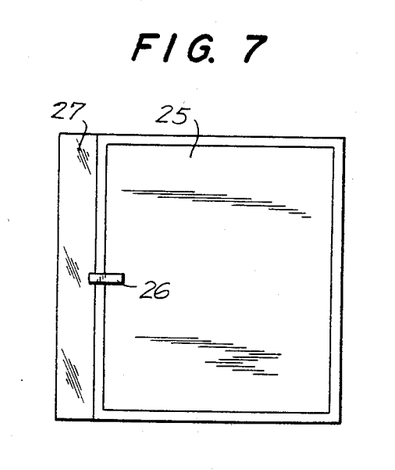
FIG. 7 is a top plan view of a liquid crystal cell including a MIM element constructed in accordance with the invention.
Figure 8:
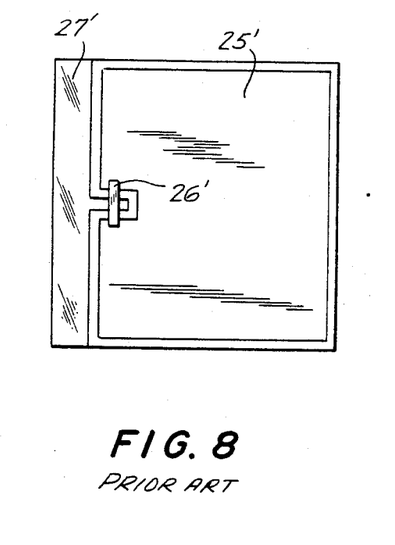
FIG. 8 is a top plan view of a liquid crystal cell including a MIM element constructed in accordance with the conventional technique.

Referring now to FIGS. 7 and 8 the effect of providing and electro-optical device with an MIM element constructed according to the invention is shown. FIG. 7 is a plan view of a liquid crystal display device including an MIM element in accordance with the invention, and FIG. 8 is a plan view of liquid crystal display device having an MIM element of the conventional art. As illustrated in FIG. 7, a transparent electrode 25 coupled to an MIM element 26 and data line 27 for driving liquid crystal material in accordance with the invention can be larger than electrode 25' when using a conventional MIM element 26'. This results in a higher display efficiency. Additionally, the element construction in accordance with the invention is simplified so that restrictions applied to designing are relaxed and more LCD applications become available.

As disclosed above, the thickness of the insulating film formed in the vertical direction is different from that formed in the horizontal direction. This overcomes the effect on the MIM element formed in the vertical direction. In another embodiment of the invention, this vertical effect can also be overcome by changing the kind of insulation used. For example, insulating film 13 formed on metal film 11 of the MIM element shown in FIG. 4 may be made of an inorganic insulator, such as $SiO_2$, $Si_3N_4$, $Al_2O_3$ or an organic insulator, such as a polyamide.

Figure 9:
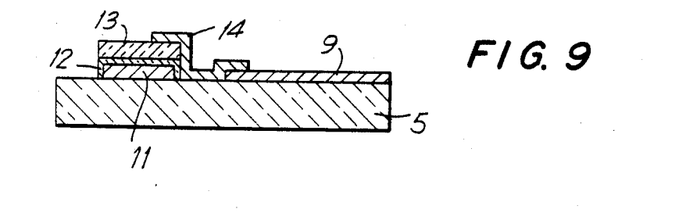
FIG. 9 is a cross-sectional view of an MIM element constructed in accordance with the invention.

The same effect of this invention can also be achieved by stacking an insulator film on the Ta oxide film as shown in FIG. 9. Referring to FIG. 9, the MIM element shown has a metal Ta film 11 which is constructed on a transparent substrate 5 in a fixed pattern. The surface of metal film 11 is covered with an oxide film 12. Another insulating film 13 is formed on metal oxide film 12. In this way, the insulating layer formed on the top of metal film 11 (including metal oxide film 12 and insulating film 13) is thicker than insulating film 12 formed on the side of metal 11. Then a metal film 14 is formed on one side of metal 11. This results in the construction of an MIM element having the construction of metal film 11, metal oxide film 12 and metal film 14. In the actual manufacturing process, metal film 14 is also formed on the surface of the insulating layer on top of metal film 11 (including metal oxide film 12 and insulating film 13) which also result in an MIM construction.

The capacitance $C_1$ of an MIM element, capacitance $C_2$ of overlapped portion and capacitance $C_{LC}$ of a picture element of a liquid crystal picture element are respectively given by:

$$C_1 = \Sigma_0\Sigma_1 \frac{a \times c}{d_1}$$

$$1/C_2 = \left(\Sigma_0\Sigma_2 \frac{b \times c}{d_2}\right)^{-1} + \left(\Sigma_0\Sigma_1 \frac{b \times c}{d_1}\right)^{-1}$$

$$C_{LC} = \Sigma_0\Sigma_3 \frac{h^2}{d_3}$$

wherein $\Sigma_1$, $\Sigma_2$, $\Sigma_3$ are dielectric constants of the metal oxide film, insulating film and liquid crystal, respectively, d1, d2, d3 are the film thickness, a is the Ta film thickness of metal film 11, b is the length of the overlapped portion of metal film 11 and metal film 14, c is the width of metal film 14, and h is the size of one picture element of the liquid crystal display.

When the size of a picture element is 200 μm square, $\Sigma 3 = 20$ and the cell gap $d_3 = 6$ μm, the capacitance of $C_{LC}$ of the picture element becomes 1.18 pF.

When the oxide film is 500 Å in an MIM element constructed of Ta-$Ta_2O_5$-Cr, wherein $a = 0.3$ μm, $c = 20$ μm, the element becomes about 6 μm² so that the capacitance of $C_1$ of the MIM element is equal to 0.027 pF.

On the other hand, the capacitance $C_1$ of the MIM element and the capacitance $C_2$ of the overlapped portion must be much smaller than the capacitance $C_{LC}$ of the picture element in order to avoid deterioration of the effective voltage applied to the liquid crystal material. Namely, a relationship on the order of: $C_{LC} > 10 (C_1 + C_2)$ is required. Thus, the capacitance $C_2$ of the overlapped portion must be less than 0.09 pF.

Assuming that both metal oxide film 12 and insulating film 13, which are formed on the top of Ta metal film 11, are made of $Ta_2O_5$ ($\Sigma = 25$) and that insulating film 13 is approximately 3400 Å thick (which can be attained by applying 200 volts of anodizing voltage), the capacitance $C_2$ will be 0.156 pF when the thickness of the overlapped portion $b = 10$ micrometers. This value of capacitance causes an insufficient effective voltage to be applied to the liquid crystal material. Therefore, it is necessary to select an insulator having a dielectric constant that is as small as the dielectric constant of the insulating film of metal oxide 11. When insulating film 13 is made of $SiO_2$, which has a specific inductivity of 3.8, the capacitance $C_2$ of the overlapped portion becomes 0.021 pF when the thickness of the overlapped portion b is 10 micrometers and the $SiO_2$ film $d_2$ is 4000 Å thick. It is noted that the manufacture of insulating film 13 from a material, such as oxide of aluminum or an organic material such as polyamide are desirable since these materials have small dielectric constants and excellent insulating ability.

Figure 10:
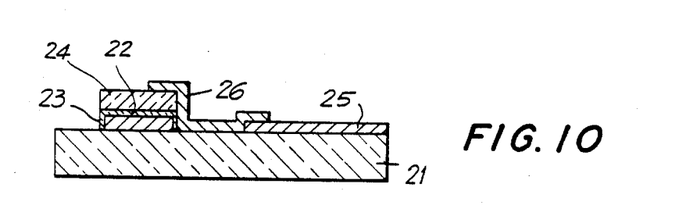
FIG. 10 is a cross-sectional view of an MIM element constructed in accordance with another embodiment of the invention.
Figure 11:
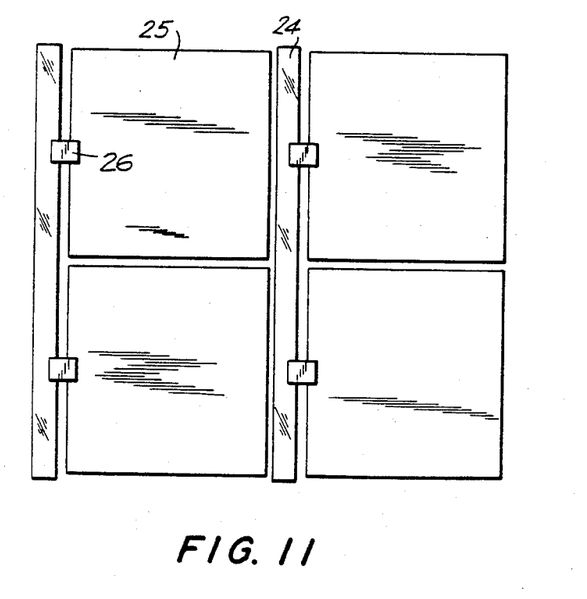
FIG. 11 is a top plan view of a liquid crystal display device utilizing MIM elements made in accordance with the invention.

Referring now to FIGS. 10 and 11 another embodiment of the invention is disclosed. In FIG. 10 a Ta film 22 having a thickness of 2500 Å is formed on a glass substrate 21 in a shape wherein one electrode of the MIM element and its wiring are simultaneously constructed. Ta anodized film 23 has a thickness of 500 Å and is formed around Ta film 22. Anodized film 23 is then covered with a $SiO_2$ film 24 on the top surface which is 5000 Å thick. In a construction made in accordance with this embodiment, $SiO_2$ film 24 is formed by a photo-etching process by being exposed from the reverse side of substrate 21 using Ta film as a mask and then being photo-etched. In this way, there are no alignment errors when putting the Ta film pattern and the $SiO_2$ pattern together. Additionally, transparent electrode 25 used for driving the liquid crystal material is formed of an ITO film. The opposite electrode of the MIM element is formed of a Cr film 26 which has a thickness of 600 Å. The MIM element is then connected to transparent electrode 25. This results in an MIM element which is 2500 Å thick and 25 micrometers long. The thickness of the overlapping portion is 10 micrometers and the size of the picture element is 0.2 millimeters.

The liquid crystal display panel using this MIM element is obtained by assembling the substrate as shown above with an opposite substrate on which a cooperating transparent electrode is provided. In this way, a high contrast display is provided when utilizing a duty cycle of 1/500.

There is another method of forming an MIM element in accordance with the present invention. The Ta pattern formed on the transparent substrate is anodized before the positive type photo-etching resist is applied. Being exposed from the reverse side of the transparent substrate, the resist pattern is constructed on the plane of the Ta oxide. A metal film such as Cr is then formed thereon, and then removed together with the resist except for both sides of the Ta pattern. This is done by using a lift-off method.

Therefore, as can be seen, according to the invention, it is possible to provide an electro-optical device having a large display panel area and having no limit on the pattern size or shape. Moreover, a liquid crystal display panel having a high resolution power can be attained through the miniaturization process of the display element pitch according to the construction of this invention.

It will thus be seen that the objects set forth above, and those made apparent from the preceding description, are efficiently attained, and since certain changes may be made in the above construction and steps without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A metal-insulator-metal device formed on a substrate, comprising:
   a substrate;
   a first metal film selectively patterned on the substrate and having a top surface and at least two side-edge surfaces;
   a first insulating film formed on the top surface and at least a portion of the two side-edge surfaces of the first metal film;
   a second insulating thick film formed on the top planar surface of the first insulating thin film; and
   a metal conductor formed on a portion of one side-edge surface of the second insulating thick film and on one side-edge of the first insulating thin film and a portion of the substrate for forming a non-linear metal-insulator-metal element between the side-edge surface of the first metal film and the metal conductor and whereby the metal conductor may be electrically coupled to a liquid crystal driving electrode.

2. The metal-insulator-metal device of claim 1, wherein the first insulating thin film is an oxide of the first metal film.

3. The metal-insulator-metal device of claim 1, wherein the substrate is transparent.

4. The metal-insulator-metal device of claim 3, wherein the substrate is glass.

5. The metal-insulator-metal device of claim 1, wherein the first metal film is tantalum and the first insulating film is a tantalum oxide thin film.

6. The metal-insulator-metal device of claim 1, wherein the metal conductor is chromium.

7. The metal-insulator-metal device of claim 1, wherein the first metal film is tantalum and the second insulating film is selected from the group consisting of $SiO_2$, $Si_3N_4$, $Al_2O_3$ and organic insulators.

8. A liquid crystal display device having a matrix of liquid crystal picture elements arranged in columns and rows with a column or row separated by a plurality of spaced parallel signal lines with each picture element electrically coupled to an associated signal line by a metal-insulator-metal device, comprising:
   a first substrate;
   a first metal film patterned to form a signal line and having a top planar surface and two opposite side-edge surfaces;
   a first insulating thin film formed on the top surface and two side-edge surfaces of the signal line;
   a second insulating thick film formed on the top planar surface of the first insulating thin film;
   a plurality of transparent liquid crystal driving electrode formed on the first substrate in a line adjacent to an associated signal line and spaced apart from each other and from the signal lines;
   a metal conductor formed on a portion of the side-edge surface of the second insulating thick film and the side-edge surface of the first insulating thin film and a portion of the substrate between the signal line and each liquid crystal driving electrode and a portion of the top of the liquid crystal driving electrode, whereby the metal-insulator-metal device is formed between the side-edge surface of the first metal film and the metal conductor.

9. The liquid crystal display device of claim 8, wherein the first insulating thin film is an oxide of the first metal film.

10. The liquid crystal display device of claim 9, wherein the first metal film is tantalum and the first insulating film is a tantalum oxide thin film.

11. The liquid crystal display device of claim 9, wherein the metal conductor is chromium.

12. The liquid crystal display device of claim 9, wherein the first metal film is tantalum and the second insulating film is selected from the group consisting of $SiO_2$, $Si_3N_4$, $Al_2O_3$ and organic insulators.

13. The liquid crystal display device of claim 8, wherein the substrate is transparent.

14. The liquid crystal display device of claim 13, wherein the first substrate is glass.

15. A process for preparing a metal-insulator-metal device on a substrate, comprising:
   providing a transparent substrate;
   forming a first metal film on the substrate and selectively patterning the film on the substrate to a pattern and having a top surface and at least two side-edge surfaces;
   forming a first insulating film on the top surface and at least a portion of the two side-edge surfaces of the first metal film;
   depositing a second insulating thick film on the top planar surface of the first insulating thin film; and
   forming a metal conductor on the side-edge surface of the first insulating thin film and second insulating thick film and a portion of the substrate and reducing the overlap portion of the conductor on the planar surface of the second insulating thick film for forming the metal-insulator-metal element between the side-edge surface of the first metal film and the metal conductor.

16. The process of claim 15, wherein the first metal film is a tantalum film and the first insulating film is a tantalum oxide formed by anodizing the first tantalum film.

* * * * *